United States Patent [19]

Appleton et al.

[11] Patent Number: 4,840,816
[45] Date of Patent: Jun. 20, 1989

[54] METHOD OF FABRICATING OPTICAL WAVEGUIDES BY ION IMPLANTATION DOPING

[75] Inventors: Bill R. Appleton, Oak Ridge, Tenn.; Paul R. Ashley, Toney, Ala.; Christopher J. Buchal, Juelich, Fed. Rep. of Germany

[73] Assignee: The United States of America as represented by the United States Department of Energy, Washington, D.C.

[21] Appl. No.: 29,570

[22] Filed: Mar. 24, 1987

[51] Int. Cl.$^4$ .......................... B05D 3/06; C23C 14/00
[52] U.S. Cl. ...................................... 427/38; 427/162; 204/192.31; 350/96.12
[58] Field of Search ..................... 204/192.31; 427/38, 427/162, 163, 43.1, 377, 383.3; 350/96.12, 96.13, 96.14; 250/492.3

[56] References Cited

U.S. PATENT DOCUMENTS

| | | | |
|---|---|---|---|
| 4,166,669 | 9/1979 | Leoberger et al. | 350/96.14 |
| 4,348,074 | 9/1982 | Burns et al. | 350/96.12 |
| 4,400,052 | 8/1983 | Alferness et al. | 350/96.12 |
| 4,445,759 | 5/1984 | Valette | 204/192.31 |
| 4,709,978 | 12/1987 | Jackel | 350/96.14 |

OTHER PUBLICATIONS

B. R. Appleton et al., "Ion Beam Process of LiNbO$_3$," Journal Materials Research 1(1), Jan/Feb 1986, pp. 104–113.
Ch. Buchal et al., "solid-Phase Epitaxy of Ion-Implanted LiNbO$_3$ for Optical Waveguide Fabrication" Journal Materials Research, 2(2), Mar./Apr. 1987, pp. 222–230.
Ch. Buchal et al., "Advanced Ti-Implanted Optical Waveguides in LiNbO$_3$," Materials Research Soc. Symp. Proc., vol. 88, 1987, pp. 93–99.
R. V. Schmidt et al., "Metal-Diffused Optical Waveguides in LiNbO$_3$," Applied Physics Letters, vol. 25, No. 8, Oct. 15, 1974, pp. 458–460.
R. C. Alferness, "Optical Guided-Wave Devices," Science, vol. 234, Nov. 14, 1986, pp. 825–829.
R. L. Holman et al., "Battelle's Proposed Cooperative Program to Develop Guided Wave Optoelectronic Manufacturing Technology," Optical Engineering, vol. 24, No. 2, Mar./Apr. 1985, pp. 251–255.
Ghandh.–"VLSI Fabrication Principles" John Wiley & Sons, New York (1983) pp. 325–326.
Sze, "VLSI Technology" McGraw-Hill Book Company, New York (1983) pp. 150–151, pp. 242–253.

*Primary Examiner*—John F. Niebling
*Assistant Examiner*—Steven P. Marquis
*Attorney, Agent, or Firm*—David E. Breeden; Stephen D. Hamel; Judson R. Hightower

[57] ABSTRACT

A method for fabricating high-quality optical waveguides in optical quality oxide crystals by ion implantation doping and controlled epitaxial recrystallization is provided. Masked LiNbO$_3$ crystals are implanted with high concentrations of Ti dopant at ion energies of about 350 keV while maintaining the crystal near liquid nitrogen temperature. Ion implantation doping produces an amorphous, Ti-rich nonequilibrium phase in the implanted region. Subsequent thermal annealing in a water-saturated oxygen atmosphere at up to 1000° C. produces solid-phase epitaxial regrowth onto the crystalline substrate. A high-quality single crystalline layer results which incorporates the Ti into the crystal structure at much higher concentrations than is possible by standard diffusion techniques, and this implanted region has excellent optical waveguides properties.

8 Claims, No Drawings

METHOD OF FABRICATING OPTICAL WAVEGUIDES BY ION IMPLANTATION DOPING

BACKGROUND OF THE INVENTION

This invention, which is a result of a contract with the U.S. Department of Energy, relates generally to the fabrication of crystalline optical waveguides and more specifically to a method of fabricating crystalline optical waveguides by ion implantation of selected dopants into single crystal substrates to form optical waveguides therein.

The development of optical and optoelectronic integrated circuits are essential for the future communications and data processing needs of industry, strategic military applications, and the consumer electronics market. Optical fibers for the transmission of optical signals have developed rapidly and the major needs now are for the development of devices capable of processing optical signals (i.e., mixers, modulators, switches, couplers, etc.). One of the primary materials for fabricating guided wave electro-optic devices is single crystalline lithium niobate ($LiNbO_3$), a strong, easily polished non-hydroscopic crystal. Presently, optical waveguide devices are made from lithium niobate by thermal in-diffusion of metal dopants into the crystal to form a region of higher refractive index in which light is guided by total internal reflection at the channel boundaries. However, just as the trend in electronic semiconductor devices is toward microintegrated circuits, so are the future needs of electrooptic devices. Thermal diffusion techniques are not capable of such microfabrication because of the large depth and lateral spreading of the dopant during thermal diffusion, nor can diffusion methods be used to produce the high concentrations of dopant over shallow depths required for surface waveguides. Ion implantation doping has proved to be the solution to similar problems in semiconductor fabrication and so should be the logical solution for optical devices. However, attempts to apply this technology to the fabrication of optical waveguide devices, especially lithium niobate crystalline devices, has resulted in such severe damage and chemical decomposition that optical waveguiding properties normally provided by the dopant are destroyed. Thus, there is a need for a method of fabricating crystalline based optical waveguides which takes advantage of the control afforded ion implantation of dopants in crystalline substrates.

SUMMARY OF THE INVENTION

In view of the above need, it is an object of this invention to provide a method of fabricating optical waveguides by ion implantation of metal dopants into optical quality crystals which overcomes the problems of radiation damage, chemical decomposition and insufficient dopant concentrations in the near-surface region.

Further, it is an object of this invention to provide a method of fabricating high quality optical waveguides by ion implantation of selected heavy metal dopants into lithium niobate crystals.

Other objects and many of the attendant advantages of the present invention will be obvious to those skilled in the art from the following detailed description.

In summary, the invention is a method for fabricating optical waveguides in an oxide crystalline substrate by ion implantation with a heavy metal dopant at low temperatures which substantially prevents thermal and radiation-enhanced diffusion of the dopant metal, followed by annealing the implanted crystal in a water saturated oxygen atmosphere at a selected temperature and period of time sufficient to provide epitaxial regrowth of the implanted damaged region to restore the crystalline structure.

In accordance with one aspect of the invention, an optical waveguide is formed in $LiNbO_3$ single crystals by ion implantation of a selected dopant into the crystal followed by controlled annealing. This alters the refractive index of the crystal in the doped regions sufficient to provide guiding of light through the implanted channel. The method includes directing a beam of ions of a metal selected from the group consisting of Ti, Cs, Pb, Cu, Ag, Cr, and Ni having a maximum beam energy of about 360 KeV onto a selected patterned surface region of a $LiNbO_3$ single crystal substrate maintained at liquid nitrogen temperature in a high vacuum environment. The beam intensity and energy may be controlled sufficient to implant ions into the crystal to a selected depth and concentration suitable for the desired waveguiding properties. The implanted crystal is them annealed in a water saturated oxygen atmosphere at a temperature in the range of from 800° to 1000° C. for a short period of time sufficient to provide epitaxial regrowth of the ion implanted region of the crystal that restores the crystalline structure and incorporates the implanted dopant into the crystal lattice.

These techniques have been used to fabricate planner waveguides, channel waveguides and Mach-Zehnder modulators. Tests of optical waveguides formed by the above method using Ti dopant have shown that guides may be produced with propagation losses less than 1 db/cm.

DETAILED DESCRIPTION

According to this invention, it has been found that optical waveguides may be fabricated from optical quality single crystals using ion implantation of selected metal dopants such as Ti, Cs, Pb, Cu, Ag, Cr, and Ni and controlled annealing procedures. Optical quality oxide single crystals, such as lithium niobate, lithium tantalate, and potassium niobate may be used even though the radiation damage from ion implantation leaves the region of implantation heavily defected or even amorphous. By implanting dopants into the crystalline material in an ion implantation high vacuum chamber adapted to keep the crystal near −190° C. during the ion implantation step, diffusion of the highly mobile crystalline constituents is avoided. The implanted dose of the selected ion is limited only by sputtering and densities up to $5 \times 10^{17}$ ions/cm$^2$ have already been demonstrated. Best results are achieved so far at 1.2 to $2.5 \times 10^{17}$ ions/cm$^2$ at 360 keV implant energy. It is a virtue of this invention that these parameters may be varied widely to optimize the required waveguide channel configuration within the crystal for the intended application.

After completion of the low temperature implant, the crystals are maintained at low temperatures until they are ready for thermal treatment to inhibit the diffusion of the constituent elements which destroys local stoichiometry and thus the light guiding properties of the crystal. The thermal treatment step is performed by annealing the crystal in a water saturated oxygen atmosphere at temperatures in the range of from about 800° to 1000° C. for relatively short periods of about 40 to 60 minutes to produce solid-phase epitaxial regrowth of the ion implanted regions of the crystal. This epitaxial regrowth process restores crystal perfection, limits lateral diffusion of the implemented dopant, and incorporates the dopant into the crystal at concentrations much higher than is possible with normal in-diffusion techniques.

Both surface and channel type waveguides, as well as Mach-Zehnder modulators, have been fabricated by this process, and have been found to perform very well with light propagation losses less than 1 db/cm.

The most significant advantage of this process is the improvements in fabrication of positive index waveguides in $LiNbO_3$ by ion implantation, which are preferred for optoelectronic integrated circuits. $LiNbO_3$ single crystals are widely utilized for the fabrication of optical elements and control devices because of the strength and high quality of the crystals and because they possess both electro-optic and piezoelectric effects. Further, these single crystals are commercially available in well polished, optical-grade form in various sizes suitable for waveguide fabrication. Thus, the invention will be illustrated in terms of the fabrication of optical waveguides in $LiNbO_3$ to illustrate applicability of ion implantation doping techniques to $LiNbO_3$ and other oxide crystals.

EXAMPLE

Titanium-doped lithium niobate surface channel waveguides were fabricated from crystals purchased from Crystal Technology, 1035 Meadow Circle, Palo Alto, Calif., 94303. These crystals were rectangular, x-cut, single crystals one-half inch by one inch and 1/16 inch thick. The crystals were prepared for ion implantation along selected pattern channels by first transferring a reversed image design layout onto the surface of the crystal to be implanted by conventional photolithographical masking techniques. This reversed design layout leaves the waveguide channel area to be implanted covered with the photo resist pattern. A metal mask was then formed on the crystal by vapor depositing titanium metal onto the crystal face over the photo resist pattern to form a uniform layer of about one micrometer thickness. The photo resist was then removed by placing the crystal in a photo resist solvent, leaving the future waveguiding channel free of the masking metal and accessible for ion implantation.

To provide the required cooling of crystals during ion implantation, the crystals were clamped in the vaccum chamber securely against a coldfinger and mounted in an ion implantation chamber at 10-7 Torr vacuum. The coldfinger was filled with liquid nitrogen to maintain the crystal at a temperature of about $-190°$ C. during ion implantation. The metal-masked crystal surface was exposed to a uniform, 360 keV enery $^{48}Ti^{++}$ beam at an effective current density of about 6 microampers/$cm^2$ or less. Under these conditions the near surface of the $LiNbO_3$ is damaged and becomes essentially amorphous to a depth of about 0.5 micrometers and the Ti is distributed in a gaussian profile to an average depth of about 0.3 micrometers.

Use of a Ti mask during the implantation process is very important because some atoms from the mask edge can be recoil implanted by the incident ion beam and foreign atoms other than Ti could generate active scattering centers and degrade the waveguiding properties of the final sample.

As a result of low temperature implantation the crystal surface becomes amorphous, has a dark apaque appearance, and contains a high concentration of Ti. The sample was maintained at low temperature until just prior to annealing to avoid Li out-diffusion. After removal from the implant chamber, and immediately prior to thermal annealing, the Ti mask was removed by chemical etching in dilute HF acid. This process does not affect the $LiNbO_3$ substrate or implanted ions beneath the surface. The implanted sample was then inserted into a water-saturated oxygen atmosphere in an annealing furnace pre-heated to 1000° C. and annealed for 60 minutes. This annealing step resulted in the complete epitaxial recrystallization of the implanted region. The crystal regained its clear and shiny appearance, and showed no evidence of surface deposits of Li or cloudy areas which were a problem in previous attempts to fabricate $LinbO_3$ waveguides by implantation at higher temperatures and annealing at either higher or lower temperatures. Positive ion scattering and channeling analyses, and optical measurements showed that the implanted region is transformed into a nearly perfect crystal with incorporation of high concentrations of Ti into the crystal structure.

Crystals treated in this fashion were then tested for waveguiding properties using helium-neon laser light coupled to the polished edge of the $LiNbO_3$ through a prism. The samples showed good waveguiding properties with propogation losses of less than 1 db/cm. For waveguides implanted with $2.5 \times 10^{17}$ Ti ions/$cm^2$ and annealed for 1 hour at 1000° C., the surface concentration of Ti is increased to about 12 atomic percent compared to only about 3 atomic percent for diffused guides, and the measured effective index of refraction for the sample was 2.218 and the calculated change in the material index is 0.03 in the Y-direction.

Various implantation tests were performed at different implant energies and different temperatures to study the ion induced surface decomposition prior to the discovery of implanting at low temperatures ($-190°$ C. or below) and a limited ion energy range of from about 180 to 360 keV. Further, the low temperature implantation retards Li and oxygen diffusion and precipitation within the implanted area. Therefore, the crystals must be processed immediately after implantation or stored at liquid nitrogen temperatures until further processed.

After implantation the crystal is amorphized over the implanted depth and is in a metastable state which contains high concentrations of dopant. At elevated temperature the highly mobile Li would diffuse toward the surface and precipitate irreversibly. In order to promote epitaxial regrowth, the crystal must be heated to induce atomic reordering at the interface between the undamaged substrate and the amorphous implanted surface. However, if temperatures are too high, diffusion increases and the implanted Ti profile is diluted beyond what is desirable for surface waveguide fabrication. Therefore, rapid, low-temperature regrowth appeared to be advantageous and experiments were conducted to study the regrowth as a function of annealing temperature.

However, early experiments showed that a minimum annealing temperature of 550° C. appeared to be necessary to achieve any noticeable lattice improvement by solid-phase epitaxy. Therefore, $2 \times 10^{16}$ Ti/$cm^2$ at 360 keV was implanted into eight x-cut $LiNbO_3$ single crystals as in the above example and their regrowth characteristics were studies as a function of annealing temperature. All samples were inserted and removed very rapidly from the preheated annealing oven to minimize the effects of warmup and cooldown. They stayed for 45 minutes in wet oxygen atmosphere at selected temperatures ranging from 550° to 900° C. These samples were analyzed using 2.5 MeV He ion scattering/channeling techniques. Results showed that in the as-implanted state, the crystallinity is destroyed over a depth of 0.35 $\mu$m. Annealing at a temperature of at least 550° C. gives a remarkable recovery over the implanted depth. The ion channeling spectrum still showed strong dechanneling over the entire energy range, due to a very high defect density remaining in the implanted region. At 600° C., 650° C., 700° C., and 750° C. a continuous, slow increase in crystalline quality was observed until at 800° C. there was a drastic improvement in the channeling spectrum. Further increases in annealing temperature produced slightly better crystalline quality, until at 900° C. the channeling spectrum of an implanted and annealed sample became indistinguishable from a perfect virgin crystal.

However, none of the samples investigated at Ti doses of $2 \times 10^{16}$ Ti/cm$^2$ displayed any optical waveguiding and it was found that a Ti dose of at least $1.2 \times 10^{17}$ Ti/cm$^2$ was necessary to fabricate waveguides. Therefore, several samples were implanted with a dose of $1.2 \times 10^{17}$ Ti/cm$^2$ at 360 keV. All crystals were subjected to a well-controlled annealing step (20 minutes to 1000° C.) and cooldown (40 minutes) procedure, which has been established as optimal for diffused waveguide fabrication. The "hold times" ($t_h$) at 1000° C. were 0 minutes, 15 minutes, and 30 minutes. Subsequent analysis showed than an implant edge is still visible after the 1000° C. ramping with no hold time ($t_h=0$), and in addition a very strong Ti near-surface precipitation is observed. Hold times of 15 and 30 minutes were found to be sufficient to result in a smoothly varying Ti distribution, characterized by a maximum concentration of Ti at the surface droping to half this maximum concentration at about 0.5 $\mu$m at $t_h=15$ minutes and 0.66 $\mu$m at $t_h=30$ minutes. These two samples displayed very good waveguiding with propagation losses as low as 1 db/cm. The Ti concentrations in the near-surface region are much higher than is possible with standard diffusion techiques. Their surfaces were smooth and shiny and there were no visible precipitates. The crystalline regrowth was nearly perfect, giving a channeling surface peak which is identical to that of a virgin surface. A small amount of dechanneling was noted in the implanted aligned area which is probably due to dislocations, which have been observed in diffused waveguides also.

In search for optimum waveguide fabrication conditions, the best results were found at regrowth temperatures of 1000° C., for implanted Ti doses of $>1.2 \times 10^{17}$ Ti/cm$^2$, 360 keV. A short anneal at 1000° C. (15 minutes) gives a near surface Ti concentration of 12 percent of the bulk Nb concentration, falling to six percent at 0.5 $\mu$m depth. The Ti dose was increased to $3 \times 10^{17}$ Ti/cm$^2$ at 360 keV, but at this concentration a milky surface precipitation was observed resulting in very poor waveguiding. Good waveguiding was observed at a maximum Ti concentration of $2.5 \times 10^{17}$ Ti/cm$^2$, at 360 keV Ti energy. The Ti dopant profiles of two guides implanted with the high dose of $2 \times 10^{17}$ and $2.5 \times 10^{17}$ Ti/cm$^2$ were measured. At these doses it takes approximately 60 minutes at 1000° C. to accomplish the necessary annealing and the depth at which the Ti concentration decreases to half that at the surface is increased to 1 $\mu$m. Analyses showed that there is a perferential diffusion of Ti in the implantation region toward the surface which facilitates the formation of superior wave guides. The near-surface concentration of Ti gets as high as 12 percent, which should be compared to typical values of three percent for diffused guides. The measured effective index for the sample with $2.5 \times 10^{17}$ Ti/cm$^2$ is 2.218 and the calculated change in material index is 0.030 for propagation in the y direction. For a dose of $2 \times 10^{17}$ Ti/cm$^2$ these numbers are reduced to 2.213 and 0.025, respectively.

In an attempt to study the movement of the crystalline to amorphous interface during annealing, the regrowth temperature was lowered to 800° C. for samples implanted with Ti doses of $1.5 \times 10^{17}$ Ti/cm$^2$, at 360, 224, and 132 keV energies. At this annealing temperature the movement of the crystallinity interface could be followed very easily as a function of time by partially annealing the crystals in time increasing steps and performing positive ion channeling analysis to determine the interface position, or depth. Results clearly showed the stepped movement of the interface, thereby providing that epitaxial regrowth from the crystalline substrate was taking place in the system.

Thus, it will be seen that a method has been provided to fabricate stable optical waveguides by ion implantation of heavy metal ion dopants into optical grade oxide crystals. It has been shown that recrystallization occurs by solid phase regrowth from the underlying crystalline substrate and that carefully selected processing conditions can result in near perfect recrystallization without harmful residual defects following implantation which would impair the waveguiding properties of the optical waveguiding channel.

It has also been found that the ion species can be varied with ease. Experiments have been performed by implanting Ag, Cu, V, Ni, Cr, and Cs into lithium niobate single crystals in the same manner as described in the above example for Ti implantation. These experiments have shown that this processing technique may be used to fabricate optical waveguides with different metal ions.

Further, the results obtained using a more complex four-component crystal like LiNbO$_3$ show that other optical quality oxide crystals may be processed by the described ion implantation and controlled epitaxial regrowth method to produce optical waveguides using appropriate metal dopants as is used in present diffusion techniques.

The ability to fabricate waveguides by ion implantation doping opens several important new areas not accessible by thermal diffusion techniques. The lateral and depth spreading of dopants introduced by thermal diffusion are often too great when extremely small devices are necessary. This is because the dopants diffuse in both directions under thermal diffusion and can "short out" neighboring devices on an integrated circuit chip, for example. This is not a problem with the present method of ion implantation doping due to the control of diffusion of the dopant outside of the unmasked implanting area of the crystal and the controll of the recrystallization process.

Furthermore, by solving the severe damage and recrystallization effects which result from implantation of complex optical materials like LiNbO$_3$ the processing technique of ion implantation, which is widely use in industry for semiconductor devices, can now be applied to LiNbO$_3$ device fabrication. Finally, because the depth concentration of implanted dopant can be controlled by controlling the ion energy, new device configurations such as burried waveguides can be fabricated by ion implantation.

The invention has been illustrated by means of a specific example of implanting LiNbO$_3$ with a Ti dopant to enable others skilled in the art to utilize the invention in various embodiments and with various modifications as are suited to the particular use contemplated. The illustrated example is not intended to be exhaustive or to limit the invention to the precise forms disclosed, and obviously many variations are possible without departing from the spirit and scope of the invention as set forth in the claims appended hereto.

We claim:

1. A method for fabricating an optical waveguide in an oxide crystalline substrate, comprising the steps of:
    providing said crystalline substrate in the form of an optical quality crystalline oxide body;
    implanting a dopant into said crystalline oxide body over a selected waveguiding region by directing a beam of ions of a selected heavy metal dopant onto a patterned region defining said selected region of said crystalline oxide body at a selected concentration and energy for a period sufficient to alter the refractive index of said crystalline oxide body to provide optical waveguiding through said patterned region while maintaining said oxide body at a low temperature sufficient to substantially prevent thermal diffusion of said dopant and disloged crystal atoms within said crystalline oxide body; and
    annealing said crystalline oxide body in a water saturated oxygen atmosphere at a selected temperature and period of time sufficient to induce epitaxial regrowth of the ion implanted region of said crystalline structure of said crystalline oxide body to restore crystal structure and incorporate said dopant into the crystalline lattice of said oxide body.

2. The method of claim 1 wherein said oxide crystalline sustrate is a LiNbO$_3$ crystalline body.

3. The method of claim 2 wherein said heavy metal dopant is selected from the group consisting of Ti, Cs, Pb, Cu, Ag, Cr, and Ni.

4. The method of claim 3 wherein said LiNbO$_3$ crystalline body is maintained at a temperature of about $-190°$ C. in a high vacuum environment during said implanting step and subsequently maintained at said low temperature prior to said annealing step.

5. The method of claim 4 wherein said annealing step is carried out at a temperature in the range of from 800° to 1000° C.

6. A method for fabricating optical waveguide channel regions in an optical quality LiNbO$_3$ single crystal, comprising the steps of:
    applying a coating of a suitable ion masking material onto a selected surface of said crystal to form a masked surface having openings aligned with said waveguide channels to be formed in said crystal;
    implanting a dopant metal into said channel regions of said crystal by directing a beam of ions of a metal dopant selected from the group consisting of Ti, Cs, Pb, Cu, Ag, Cr, and Ni onto said masked surface of said crystal at a selected density and energy for a period to implant sufficient ions of said metal dopant into said crystal to alter the refractive index thereof in said waveguide channel regions to a degree sufficient to produce the desired light waveguiding properties of said channel regions;
    removing said masking metal from said surface of said crystal; and
    annealing said crystal in a water saturated oxygen atmosphere at a temperature in the range of from 800° to 1000° C. for a period sufficient to produce epitaxial regrowth of said ion implanted regions of said crystal to essentially the original crystalline structure of said LiNbO$_3$ single crystal.

7. The method of claim 6 wherein said dopant metal is Ti and wherein said implanting step is carried out in a vaccum environment at a pressure of at least $10^{-7}$ Torr and at an ion beam energy of 360 keV for a period sufficient to provide a dopant density in the range of from $1.2 \times 10^{17}$ to $2.5 \times 10^{17}$ Ti/cm$^2$ in said channel regions of said crystal.

8. The method of claim 7 wherein said ion masking material is titanium.

* * * * *